United States Patent  (10) Patent No.: US 9,905,491 B1
Yoon et al.  (45) Date of Patent: Feb. 27, 2018

(54) INTERPOSER SUBSTRATE DESIGNS FOR SEMICONDUCTOR PACKAGES (71) Applicants: In Sang Yoon, Seoul (KR);
DeokKyung Yang, Hanam-si (KR);
SeongHun Mun, Bucheon-si (KR)

(72) Inventors: In Sang Yoon, Seoul (KR);
DeokKyung Yang, Hanam-si (KR);
SeongHun Mun, Bucheon-si (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 116 days.

(21) Appl. No.: 14/039,938

(22) Filed: Sep. 27, 2013

(51) Int. Cl.
*H01L 21/50* (2006.01)
*H01L 23/538* (2006.01)
*H01L 23/31* (2006.01)

(52) U.S. Cl.
CPC .................. *H01L 23/3128* (2013.01)

(58) Field of Classification Search
CPC ...... H01L 21/50; H01L 23/538; H01L 23/522
See application file for complete search history.

(56) References Cited

U.S. PATENT DOCUMENTS

| 5,766,986 | A | 6/1998 | Weber et al. | |
| 5,963,430 | A * | 10/1999 | Londa | H01L 23/3128 257/686 |
| 6,531,335 | B1 | 3/2003 | Grigg | |
| 6,759,307 | B1 | 7/2004 | Yang | |
| 6,780,670 | B2 | 8/2004 | Park | |
| 6,838,319 | B1 | 1/2005 | Williams | |
| 7,767,498 | B2 | 8/2010 | Moro et al. | |
| 7,872,359 | B2 | 1/2011 | Inoue | |
| 8,106,495 | B2 | 1/2012 | Kajiki | |
| 8,183,675 | B2 | 5/2012 | Chow et al. | |
| 8,247,894 | B2 * | 8/2012 | Yoon | H01L 23/13 257/678 |
| 8,748,229 | B2 * | 6/2014 | Nishimura et al. | 438/108 |
| 2007/0148822 | A1 * | 6/2007 | Haba | G01R 31/2886 438/110 |
| 2009/0032927 | A1 * | 2/2009 | Kim et al. | 257/686 |
| 2012/0164791 | A1 | 6/2012 | Km et al. | |
| 2012/0187598 | A1 | 7/2012 | Lee et al. | |
| 2012/0241950 | A1 * | 9/2012 | Takahashi | H01L 21/561 257/737 |
| 2013/0181359 | A1 * | 7/2013 | Wu | H01L 25/105 257/777 |

FOREIGN PATENT DOCUMENTS

JP    2004179578 A    6/2004

* cited by examiner

*Primary Examiner* — Matthew Landau
*Assistant Examiner* — Krista Soderholm
(74) *Attorney, Agent, or Firm* — Wong & Rees LLP (57) ABSTRACT

Semiconductor packages with multiple substrates can incorporate cavities in a portion of an upper substrate to minimize or reduce void formations during a molding process. The cavities can be formed substantially over the integrated circuit devices and not over the internal interconnects to further facilitate the flow of the molding compound. The combination with extension members or recesses on a top or exterior surface of the upper substrate can further cut down on bleeding or spill over of the molding compound between adjacent packages and improve device reliability and yield.

6 Claims, 4 Drawing Sheets

INTERPOSER SUBSTRATE DESIGNS FOR SEMICONDUCTOR PACKAGES

TECHNICAL FIELD

The present disclosure relates in general to semiconductor devices and packages, more particularly, to interposer substrate designs for mitigating void formations and reducing bleeding of the molding compound during a molding process.

BACKGROUND

Electronic products have become an integral part of our daily lives. Packages of components such as semiconductor circuits, transistors, diodes, and other electronic devices have become smaller and thinner with more functions and connections. In packaging components, the need for coupling components together in a reliable manner can influence the manufacturing processes.

In view of the ever-increasing commercial competitive pressures, along with growing consumer expectations and the diminishing opportunities for meaningful product differentiation in the marketplace, it is increasingly critical that answers be found to these problems. Additionally, the need to reduce costs, improve efficiencies and performance, and meet competitive pressures adds an even greater urgency to the critical necessity for finding answers to these problems.

SUMMARY

Semiconductor packages with multiple substrates can incorporate cavities in a portion of an upper substrate to minimize or reduce void formations during a molding process. The cavities can be formed substantially over the integrated circuit devices and not over the internal interconnects to further facilitate the flow of the molding compound. The combination with extension members or recesses on a top or exterior surface of the upper substrate can further cut down on bleeding or spill over of the molding compound between adjacent packages and improve device reliability and yield.

In one embodiment, a semiconductor package includes a first substrate having a first surface and a second surface opposite the first surface. An integrated circuit device can be mounted on the first surface along with a plurality of internal interconnects on the same first surface around the integrated circuit device such that each internal interconnect has a first height. A second substrate having a third surface and a fourth surface opposite the third surface can be mounted over the integrated circuit device and the first substrate such that the third surface of the second substrate is in contact with the plurality of internal interconnects and faces the first surface of the first substrate.

In one embodiment, a cavity can be formed on the third surface extending into the second substrate, the cavity being substantially over and above the integrated circuit device to configure a second height. The second height is measured from a base of the cavity to a top surface of the integrated circuit device such that the ratio of the first height to the second height is less than about 5.0 to 1.0. In some embodiments, the ratio can be in the range of from about 2.0 to about 4.5 for the first height relative to 1.0 for the second height.

In one embodiment, the package includes a plurality of external interconnects mounted on the second surface. In some embodiments, the package can further include an extension member formed on the fourth surface, where the extension member can be formed about a peripheral region of the second substrate such that an edge of the extension member is co-planar with an edge of the second substrate. In other embodiments, the package can further include a recess formed on the fourth surface extending into the second substrate, the recess being similar to that of the cavity but formed about an edge of the second substrate.

In one embodiment, the package can further include an encapsulation between the first substrate and the second substrate, where the encapsulation substantially encapsulates the first substrate, the second substrate, the internal interconnects, the integrated circuit device, and the cavity. The encapsulation can be substantially free of void formation in this instance.

In one embodiment, a semiconductor package includes a first substrate having a first surface and a second surface opposite the first surface. An integrated circuit device can be mounted on the first surface of the first substrate along with a plurality of internal interconnects on the same first surface of the first substrate around the integrated circuit device such that each internal interconnect has a first height. A second substrate having a third surface and a fourth surface opposite the third surface can be mounted over the integrated circuit device and the first substrate such that the third surface of the second substrate is in contact with the plurality of internal interconnects and faces the first surface of the first substrate.

In one embodiment, a cavity can be formed on the third surface extending into the second substrate, the cavity being substantially over and above the integrated circuit device to configure a second height. The second height can be measured from a base of the cavity to a top surface of the integrated circuit device, with the second height being in the range of from about 20% to about 35% of the first height. This package includes an extension member formed on the fourth surface of the second substrate. The extension member can be formed about a peripheral region of the second substrate such that an edge of the extension member is co-planar with an edge of the second substrate.

In one embodiment, the cavity formed on the third surface of the second substrate is substantially over and above the integrated circuit device but not over the plurality of internal interconnects. In another embodiment, the third surface is not in contact with the integrated circuit device. In yet another embodiment, the edge of the extension member is co-planar with an edge of the first substrate.

In one embodiment, the package includes a plurality of external interconnects mounted on the second surface. In another embodiment, the package further includes an encapsulation between the first substrate and the second substrate, with the encapsulation substantially encapsulating the first substrate, the second substrate, the internal interconnects, the integrated circuit device, and the cavity. The encapsulation is substantially free of void formation in this instance.

In some embodiments, the first height is in the range of from about 100 microns to about 200 microns. In other embodiments, the second height is in the range of from about 35 microns to about 50 microns.

In one embodiment, a semiconductor package includes a first substrate having a first surface and a second surface opposite the first surface. An integrated circuit device can be mounted on the first surface of the first substrate along with a plurality of internal interconnects on the same first surface of the first substrate adjacent the integrated circuit device such that each internal interconnect has a first height. The integrated circuit device can be mounted on the first substrate via a plurality of device interconnects, the plurality of device interconnects being between the first surface of the first substrate and the integrated circuit device. An encapsulation can be used to encapsulate the plurality of device interconnects and portions of the first substrate and the integrated circuit device leaving an upper surface of the integrated circuit device exposed.

In one embodiment, a second substrate having a third surface and a fourth surface opposite the third surface can be mounted over the integrated circuit device and the first substrate such that the third surface of the second substrate is in contact with the plurality of internal interconnects and faces the first surface of the first substrate. The third surface, in this embodiment, is not in contact with the integrated circuit device.

In one embodiment, the package further includes a cavity that can be formed on the third surface extending into the second substrate to configure a second height. The second height can be measured from a base of the cavity to the upper surface of the integrated circuit device, where the second height can be in the range of from about 15% to about 40% of the first height. In this embodiment, a recess can be formed on the fourth surface extending into the second substrate, the recess being formed about an edge of the second substrate.

In one embodiment, the cavity formed on the third surface of the second substrate is substantially over and above the integrated circuit device but not over the plurality of internal interconnects. In another embodiment, the package further includes a plurality of external interconnects mounted on the second surface of the first substrate.

In one embodiment, the package further includes a molding compound between the first substrate and the second substrate, where the molding compound substantially insulates the first substrate, the second substrate, the encapsulation, the internal interconnects, the integrated circuit device, and the cavity. The molding compound is substantially free of void formation and not in contact with the device interconnects.

In some embodiments, the first height can be in the range of from about 100 microns to about 200 microns. In other embodiments, the second height can be in the range of from about 35 microns to about 50 microns.

Other variations, embodiments and features of the present disclosure will become evident from the following detailed description, drawings and claims.

DETAILED DESCRIPTION OF THE DISCLOSURE

It will be appreciated by those of ordinary skill in the art that the embodiments disclosed herein can be embodied in other specific forms without departing from the spirit or essential character thereof. The presently disclosed embodiments are therefore considered in all respects to be illustrative and not restrictive.

Figure 1A:
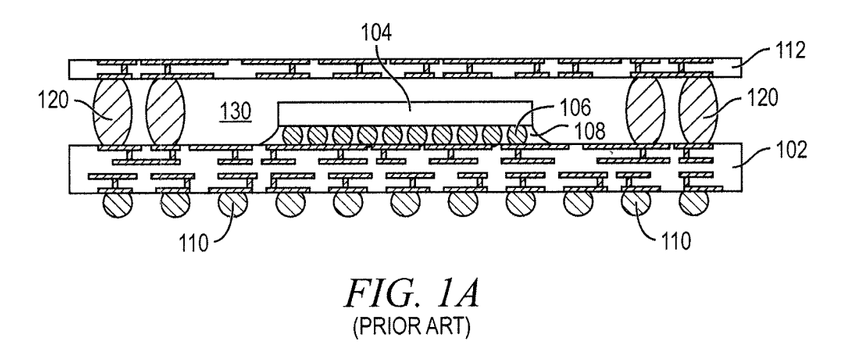
FIGS. 1A-1B are cross-sectional views of a prior art semiconductor package-on-package (PoP) with multiple substrates.
Figure 1B:
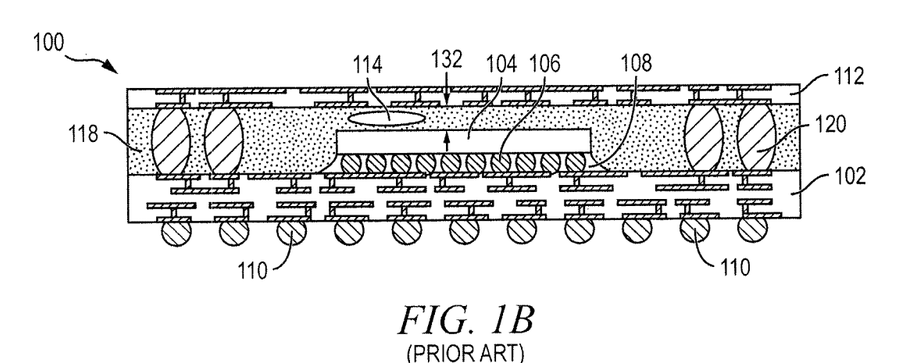

FIGS. 1A-1B are cross-sectional views of semiconductor package-on-package (PoP) with multiple substrates known in the prior art. In this instance, the semiconductor PoP 100 includes a bottom substrate 102 and a top substrate 112. The bottom substrate 102 can be a laminate substrate, a printed circuit board (PCB), a silicon substrate, an organic substrate, a ceramic substrate, a plastic substrate, a package carrier, or some other laminated or flexible structure for redistribution of signals. The top substrate 112 can be similar to that of the bottom substrate 102, and vice versa. In the alternative, the top substrate 112 can be an interposer, or a redistribution layer or material, among other suitable semiconductor substrates. Additional integrated circuit devices or packages (not shown) may be formed on an upper surface of the top substrate 112 to form the PoP structure, the integrated circuit devices or packages similar to those described below. For sake of simplicity these devices or packages will not be described in further detail but it will be understood by one skilled in the art that they may be similar to those described below.

Internal interconnects 120 can be formed on an upper or top surface of the substrate 102 to function as conductive or signal connectors while external interconnects 110 can be formed on a lower or bottom surface of the substrate 102 for substantially similar purpose and/or function. The external/internal interconnects 110, 120 can be solder balls, solder bumps, stud bumps, conductive pillars, or other conductive structures. An integrated circuit device 104 can be mounted on the same upper or top surface of the substrate 102 adjacent the internal interconnects 120. The integrated circuit device 104 can be a flip chip, a wire-bond chip or other suitable semiconductor device. In some embodiments, other types of integrated circuit devices 104 including logic, memory, passives, among others, can also be included.

The integrated circuit device 104 can be mounted on the substrate 102 via device interconnects 106 surrounded by an encapsulation 108 such as a molding compound. The device interconnects 106 may be substantially similar to the external/internal interconnects 110, 120 including without limitation solder bumps, solder balls, copper pillars, copper balls, among others. The process of forming the encapsulation 108 can be carried out using film-assisted molding, epoxy molding, moldable underfill or other protective molding process. The encapsulation 108 can protect the integrated circuit device 104 as well as the device interconnects 106 from moisture, dust and other contaminants. Alternatively, instead of device interconnects 106 and encapsulation 108, the integrated circuit device 104 can be attached to the substrate 102 via an adhesive material (not shown). In another example, the encapsulation 108 may be optional thereby leaving the integrated circuit device 104 substantially exposed.

In operation, FIG. 1A is a cross-sectional view of a PoP 100 in preparation for a molding process. The top substrate 112 has been coupled to the bottom substrate 102 via the plurality of internal interconnects 120 creating a gap or cavity 130 in between. The top substrate 112 does not contact the bottom substrate 102 directly but electrical connections or signals may nevertheless be carried out from the bottom substrate 102 or from the integrated circuit device 104 to the top substrate 112 via the plurality of internal interconnects 120. To improve package reliability, a molding compound 118, similar to that of the encapsulation 108, can be introduced into the package 100, to cover or protect the gap or cavity 130 as best shown in FIG. 1B. The molding compound 118 may have similar materials properties as that of the encapsulation 108 and be introduced with similar processes.

Ideally, the cavity 130 would be completely filled by the molding compound 118. However, due to the narrow region 132 between the integrated circuit device 104 and the top substrate 112, voids 114 may form leading to reliability as well as yield concerns, as the voids 114 may introduce air bubbles, moistures or other environmental impurities. The voids 114 may form because of the reduced flow of the molding compound 118 through the narrow region 132. This may become more problematic as the top substrate 112 is attached to the bottom substrate 102 prior to the introduction of the molding compound 118. Accordingly, there is a need to minimize, reduce or completely eliminate the formation of these voids 114 in a PoP device 100.

Figure 2A:
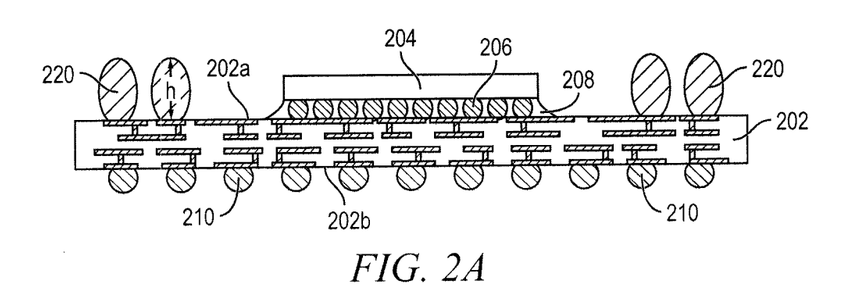
FIGS. 2A-2D are cross-sectional views of a semiconductor PoP with multiple substrates according to one embodiment of the present disclosure.

FIGS. 2A-2D are cross-sectional views of a semiconductor PoP 200 with multiple substrates according to one embodiment of the present disclosure, where the package 200 helps to mitigate void formation during a molding process. Similar to that discussed above, the semiconductor PoP 200 according to one embodiment of the present disclosure includes a first substrate 202 as shown in FIG. 2A. The first substrate 202 can have a first surface 202a and a second surface 202b, the second surface 202b opposite the first surface 202a. The first substrate 202 can be formed of the materials as discussed above including without limitation silicon, laminate, PCB, organic, ceramic, or plastic. An integrated circuit device 204 can be mounted on the first surface 202a of the first substrate 202 via a plurality of device interconnects 206 and partially covered with an encapsulation 208 similar to that described above.

A plurality of internal interconnects 220 can be formed on the first surface 202a of the first substrate 202 adjacent or around the integrated circuit device 204, the internal interconnects 220 similar to those above including without limitation solder bumps, copper bumps, solder balls or stud bumps. Each internal interconnect 220 includes a first height (h), generally in the range of from about 100 microns to about 200 microns. The internal interconnect 220 can be about 125 micron, or about 150 micron, or about 175 micron. The internal interconnect 220 can also be smaller than 100 microns or greater than 200 microns depending on design specifications. Like above, a plurality of external interconnects 210 can be mounted on the second surface 202b of the first substrate 202, the external interconnects 210 having similar material properties as those of the internal interconnects 220 and formed with similar processes.

Figure 2B:
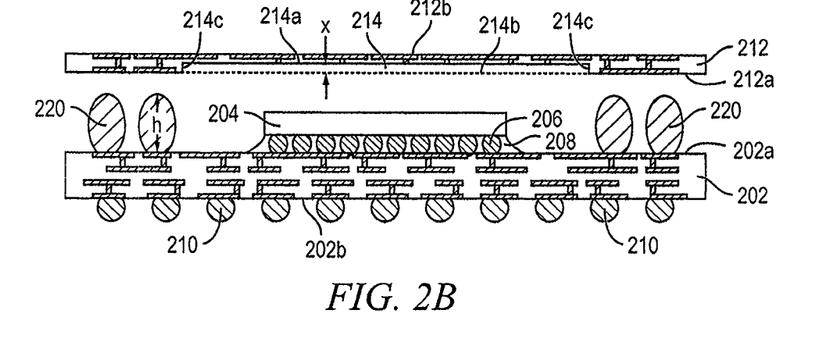

FIG. 2B illustrates the next step in forming the PoP 200 where a second or top substrate 212 can be brought into contact with the first or bottom substrate 202, the top substrate 212 of similar material properties as that of the bottom substrate 202. In some embodiments, the top substrate 212 is an interposer substrate or a redistribution layer or film. The top substrate 212 includes a third surface 212a and a fourth surface 212b, where the fourth surface 212b is opposite the third surface 212a. As shown, the third surface 212a is facing the first surface 202a as the top substrate 212 is brought into contact with the bottom substrate 202.

In one embodiment, the top substrate 212 includes a cavity 214 formed on the third surface 212a extending into a portion of the top substrate 212. In other words, a portion of the top substrate 212 is removed to form the cavity 214. The removal process can be carried out by photolithography followed by etching. In the alternative, the removal process for forming the cavity 214 can be done by known wet etching or dry etching processes, including without limitation formation using solder resist etching. In one embodiment, the cavity 214 can be pre-determined to match the size of the integrated circuit device 204. For example, the cavity 214 can be pre-configured to align with a center of the integrated circuit device 204 or with the edges of the integrated circuit device 204. In another example, the cavity 214 can be sized to accommodate the width and/or length of the integrated circuit device 204.

In one embodiment, the cavity 214 is substantially over and above the integrated circuit device 204. The cavity 214 does not encompass or is not situated over any of the internal interconnects 220. In other words, if the second substrate 212 were to be brought into contact with the first substrate 202, no portion of the cavity 214 would come into contact with any internal interconnects 220. The cavity 214 includes a base 214a and an imaginary top 214b where the top 214b would have been had the top 214b not been removed or etched as described above. The top 214b of the cavity would have been co-planar with the third surface 212a of the top substrate 212.

The difference between the top 214b and the base 214a can also be identified as a depth (x) of the cavity 214 where the depth (x) can be about 5 microns, or about 10 microns, or about 15 microns, or about 20 microns, or about 25 microns. The depth (x) can also be in the range of from about 5 microns to about 25 microns, or from about 10 microns to about 20 microns, or from about 15 microns to about 20 microns. The cavity 214 may also include two edges 214c where the edges 214c extend the entire width of the integrated circuit device 204 but does not encompass the internal interconnects 220. Although the cavity 214 has been shown to be substantially rectangular in shape, it will be appreciated by one skilled in the art that the cavity 214 can take on other polygonal shapes including oval, square, parallelogram, trapezoid, among others.

Figure 2C:
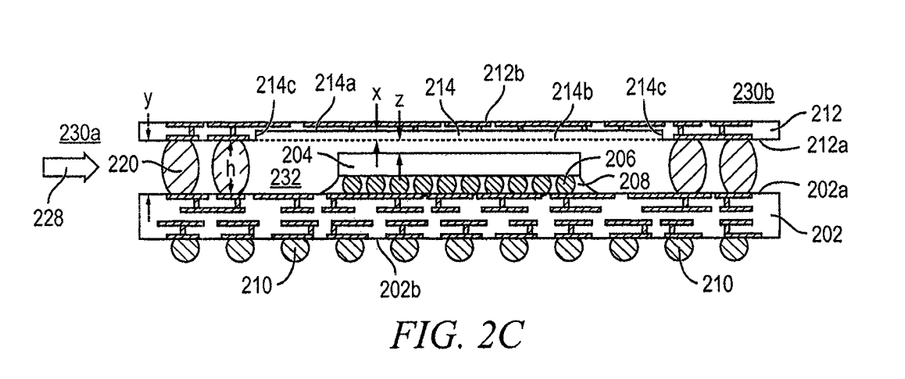

FIG. 2C illustrates the next step in forming the PoP 200 where the second substrate 212 can be mounted over the first substrate 202 and the integrated circuit device 204 such that the third surface 212a is in contact with the plurality of internal interconnects 220 and faces the first surface 202a. In this instance, the top substrate 212, when brought into contact with the bottom substrate 202, only makes contact with the plurality of internal interconnects 220 but does not come into physical contact with the integrated circuit device 204, the device interconnects 206 or the encapsulation 208. Upon contact, a second height (x+z) can be configured by the cavity 214 in view of the integrated circuit device 204. In other words, a second height is a sum of the depth (x) of the cavity 214 as well as the spacing (z) between the imaginary top 214b of the cavity 214 and the top of the integrated circuit device 204.

In the alternative, the spacing (z) can be defined as the distance between the third surface 212a and the top of the integrated circuit device 204, the spacing (z) being about 10 microns, or about 20 microns, or about 30 microns, or about 40 microns, or about 50 microns. The spacing (z) can also be in the range of from about 10 microns to about 50 microns, or from about 20 microns to about 40 microns, or from about 25 microns to about 35 microns. Collectively, the second height (x+z) can be measured from the base 214a of the cavity 214 to a top or upper surface 204a of the integrated circuit device 204.

In some embodiments, the ratio of the height (h) of the internal interconnects 220 or the first height (h) to that of the second height (x+z) can be less than about 5.0 to 1.0, or less than about 4.5 to 1.0, or less than about 4.0 to 1.0, or less than about 3.5 to 1.0, or less than about 3.0 to 1.0, or less than about 2.5 to 1.0 or less than about 2.0 to 1.0. In other words, the height (h) of the internal interconnects 220 can be generally greater than that of the spacing between the cavity 214 and the integrated circuit device 204 to the tune of about 2× to about 4.5× greater.

Once coupled, an encapsulation material or molding compound 228 may be introduced from one end 230a of the package 200 to the other, opposite end 230b of the package 200. Alternative materials and/or processes including the likes of mold under fill (MUF), encapsulation molding compound (EMC), vacuum molding or film-assisted molding (FAM) may also be utilized. Although shown to flow from left to right as indicated by the arrow 228, it is understood that the molding compound or encapsulation 228 can also flow from right to left.

In operation, the encapsulation 228 can flow through a relatively wide spacing (y), the distance between the first surface 202a of the bottom substrate 202 and the third surface 212a of the top substrate 212, which can be similar to that of the height (h) of the internal interconnects 220. As the encapsulation 228 moves from one end 230a to the other end 230b of the package 200 and encounters the integrated circuit device 204, the increased spacing (x+z) between the top of the integrated circuit device 204 and the base of the cavity 214 helps to provide a wider pathway and better flow of the encapsulation 228 so as to mitigate or minimize any internal voids (not shown) within the package 200 between the two substrates 202, 212. Eventually, the encapsulation 228 is able to return to the wider spacing (y) and completely fill out any internal spaces among the substrates 202, 212 as well as the integrated circuit device 204 and the internal interconnects 220. Additional defects including the likes of pits and/or incomplete fill may also be minimized, mitigated or eliminated due to the increased spacing, which improves flowability of the encapsulation 228.

Figure 2D:
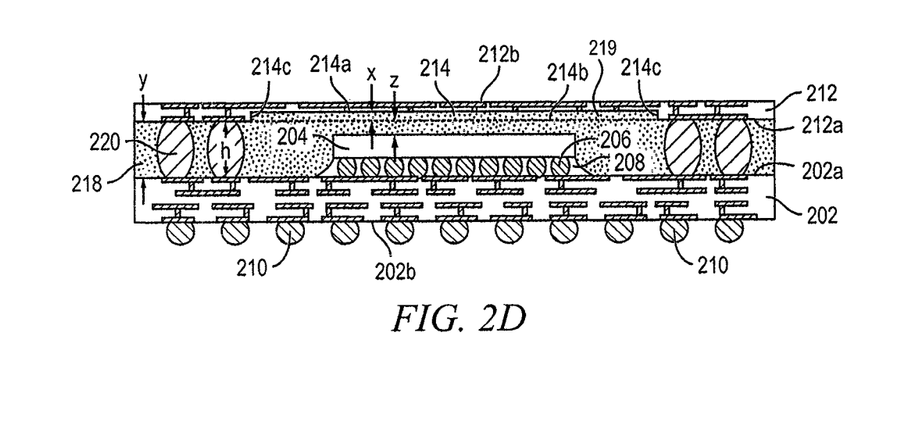

FIG. 2D illustrates a completed PoP 200 having an encapsulation 218 between the first substrate 202 and the second substrate 212, where the encapsulation 218 is substantially encapsulating the first substrate 202, the second substrate 212, the internal interconnects 220, portions of the integrated circuit device 204, as well as the cavity 214. The encapsulation 218 is in direct contact with the integrated circuit device 204 and the plurality of the internal interconnects 220 and the encapsulation 218 completely covers the first surface 202a and the third surface 212a. The encapsulation 218 can include an encapsulation protrusion 219 extending upward from the body of the encapsulation 218 and filling the cavity 214. The encapsulation protrusion 219 can extend a distance of x above the surrounding portion of the encapsulation 218. In one embodiment, the encapsulation 218 is substantially free of voids, void formations, pits or incomplete fills. This may be achieved as a result of the broader passage or increased spacing (x+z) between the integrated circuit device 204 and the base of the cavity 214. The cavity 214 is a part of the top substrate 212 and need not be removed or subjected to additional processing upon completion of the package 200.

Figure 3:
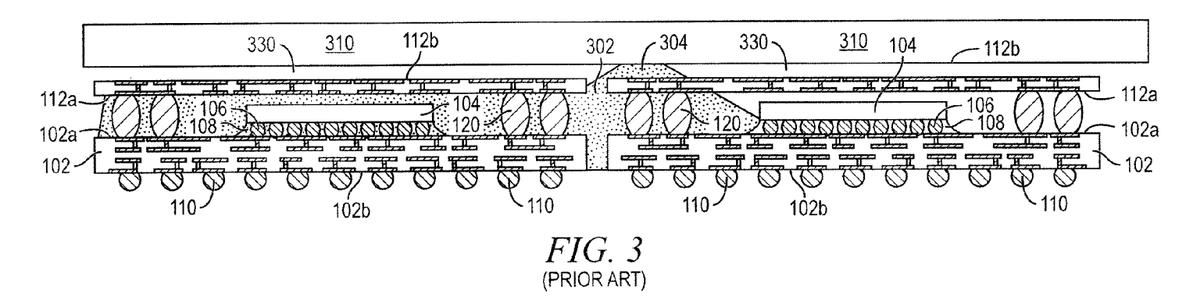
FIG. 3 is a cross-sectional view of a prior art configuration of neighboring packages with bleeding of the resin or molding compound.

FIG. 3 is a cross-sectional view of a configuration of neighboring packages with bleeding of the resin or molding compound known in the prior art. Adjacent packages similar to those shown in FIGS. 1A-1B can be mounted to a top mold chase 310 adjacent each other. During a molding process, the encapsulation or molding compound may spill over or enter the saw streets 302. This may normally not present a problem since the saw streets 302 are subsequently etched or removed by a singulation or saw process. As such, any unwanted encapsulation or molding compound may be removed. However, bleeding of the encapsulation molding compound (EMC) may invade the gap 304 between the upper surface 330 of the package and the top mold chase 310, the undesired EMC potential causes of reliability and/or yield issues. The bleeding or spill over may be made more prominent as the PoP molding processes have changed where the substrates are attached to each other prior to the introduction of the molding compound as discussed above and in earlier figures.

Figure 4:
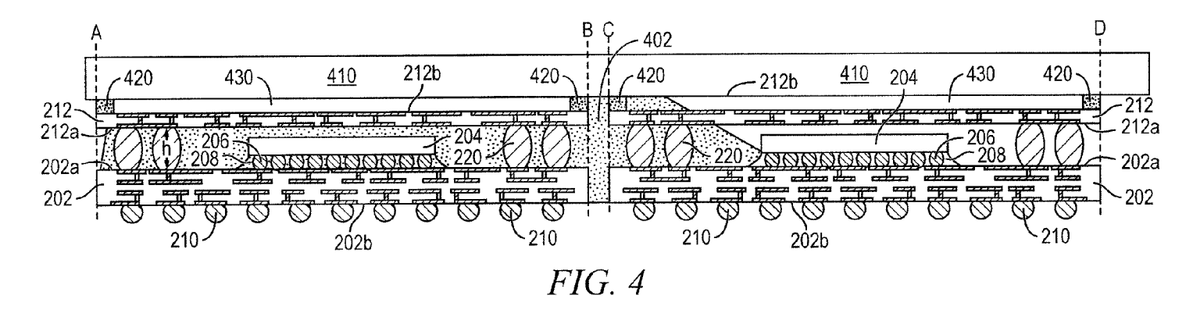
FIG. 4 is a cross-sectional view of a configuration of neighboring packages for minimizing or reducing bleeding of the resin or molding compound according to one embodiment of the present disclosure.

FIG. 4 is a cross-sectional view of a configuration of neighboring packages for minimizing or reducing bleeding of the resin or molding compound according to one embodiment of the present disclosure. In this example, the package is similar to that discussed above with the addition of extension members 420 on the upper or fourth surface 212b of the top substrate 212. The extension members 420 can be formed about a peripheral region of the top substrate 212 such that an edge of the extension member 420 can be co-planar with an edge of the second substrate 212 as illustrated by the dashed lines A, B, C, D. The extension members 420 can be formed of metal, plastic, or other suitable materials by known semiconductor processes including without limitation deposition, lithography and etching.

The extension members 420 may help to minimize or mitigate bleeding or spill over of the resin or molding compound from adjacent PoP's as shown where the encapsulation entering the saw street 402 would be stopped at the edges of the extension member 420 as well as the edges of the top substrate 212. Accordingly, no encapsulation would be able to bleed or spill over into the gap 430 between the top mold chase 410 and the packages. In some embodiments, the edges of the extension member 420 can also be co-planar with an edge of the bottom substrate 202 as illustrated by the dashed lines A, B, C, D. This may help to facilitate the singulation or saw process by having the substrates 202, 212 be in alignment with the extension members 420 so as to minimize cracking or fracturing during the saw process. The extension members, which can serve as "dams" for preventing the bleeding of the resin, will be discussed in more details in subsequent figures and discussion below.

Figure 5:
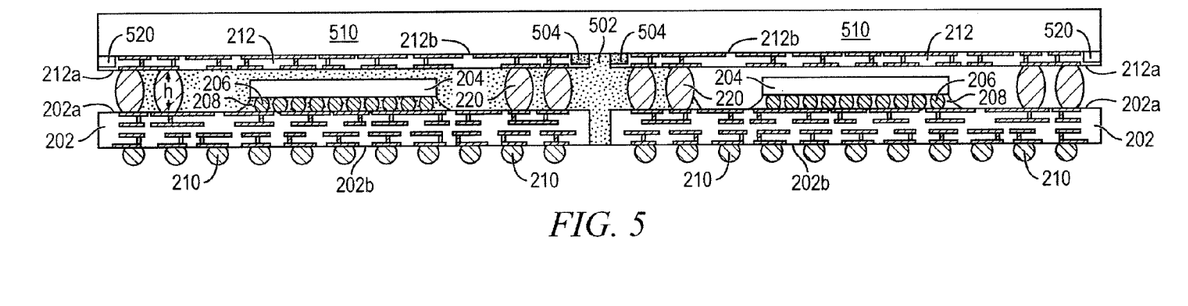
FIG. 5 is a cross-sectional view of a configuration of neighboring packages for minimizing or reducing bleeding of the resin or molding compound according to another embodiment of the present disclosure.

FIG. 5 is a cross-sectional view of a configuration of neighboring packages for minimizing or reducing bleeding of the resin or molding compound according to another embodiment of the present disclosure. In this embodiment, a plurality of recesses 520 can be formed on the upper or fourth surface 212b of the second substrate 212 similar to that of the extension members 420 above. Each recess 520 can extend into portions of the top substrate 212 similar to that of the cavity 214. In some instances, the recesses 520 can be formed with similar processing techniques as those used in forming the cavities 214. The recess 520 can be formed about an edge of the top substrate 212.

In operation, the formation of the recesses 520 allows the top substrate 212 of the package to be in direct physical contact with the top mold chase 510. Doing so helps to minimize or mitigate bleeding or spill over of the resin or molding compound from adjacent PoP's as shown where the encapsulation entering the saw street 502 would be stopped once the encapsulation fills the voids 504 created by the recesses 520. And because the top of the packages are in direct physical contact with the mold chase 510, there are no gaps for the encapsulation to spill over or bleed into. The recesses, which can serve as "trenches" for preventing the bleeding of the resin, will be discussed in more details in subsequent figures and discussion below.

Figure 6:
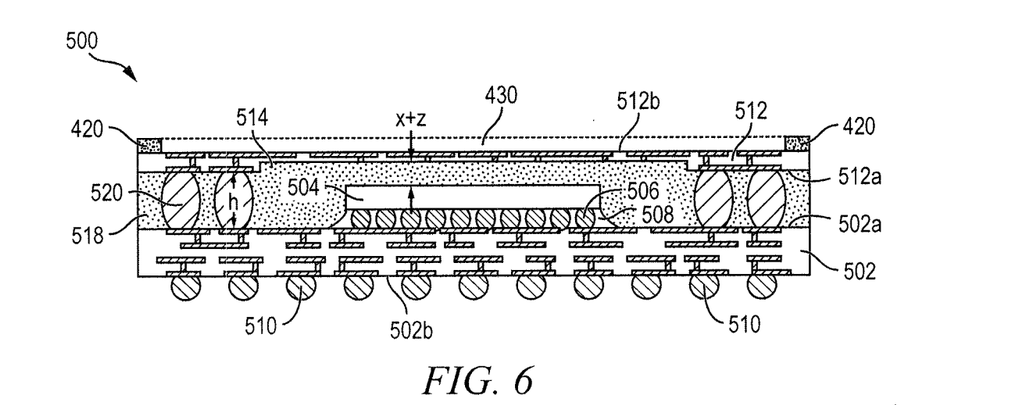
FIG. 6 is a semiconductor PoP similar to that of FIG. 4 and incorporating the cavity embodiments of FIGS. 2A-2D.

FIG. 6 is a semiconductor PoP similar to that of FIG. 4 and incorporates the cavity embodiments of FIGS. 2A-2D. In other words, FIG. 6 is a cross-sectional view of a combination of the package of FIG. 4 and that of FIGS. 2A-2D. In one embodiment, a package 500 includes a first substrate 502 having a first surface 502a and a second surface 502b opposite the first surface 502a. An integrated circuit device 504 can be mounted on the first surface 502a, with a plurality of internal interconnects 520 mounted on the first surface 502a adjacent the integrated circuit device 504, where each internal interconnect 520 includes a first height (h). In some embodiments, the first height (h) can be in the range of from about 100 microns to about 200 microns.

The package 500 includes a second substrate 512 having a third surface 512a and a fourth surface 512b opposite the third surface 512a, where the second substrate 512 is mounted over the first substrate 502 such that the third surface 512a is in contact with the plurality of internal interconnects 520 and faces the first surface 502a. A cavity 514 can be formed on the third surface 512a extending into the second substrate 512, the cavity 514 being formed similar to that discussed above. The cavity 514 includes a second height (x+z) as measured from a base of the cavity 514 to a top surface of the integrated circuit device 504, where the second height (x+z) is in the range of from about 20% to about 35% of the first height (h). In some embodiments, the second height (x+z) can be in the range of from about 35 microns to about 50 microns.

In this embodiment, an extension member 420 can be formed on the fourth surface 512b of the second substrate 512, the extension member 420 formed about a peripheral region of the second substrate 512 such that an edge of the extension member 420 is co-planar with an edge of the second substrate 512. In some instances, the edge of the extension member 420 can be co-planar with an edge of the first substrate 502. The extension member 420 can help to keep out any additional molding compound from coming into contact with the fourth surface 512b of the top substrate 512 or invading the gap 430 between the top substrate 512 and the top mold chase 410 as best illustrated in FIG. 4.

In one embodiment, the cavity 514 formed on the third surface 512a can be substantially over and above the integrated circuit device 504 but not over the plurality of internal interconnects 520. In another embodiment, the third surface 512a is not in direct, physical contact with the integrated circuit device 504. In yet another embodiment, a plurality of external interconnects 510 can be mounted on the second surface 502b of the first substrate 502 for electrical signal communication with other devices and/or external packages.

In one embodiment, the package 500 includes an encapsulation 518 between the first substrate 502 and the second substrate 512 where the encapsulation 518 substantially encapsulates the first substrate 502, the second substrate 512, the internal interconnects 520, the integrated circuit device 504, and the cavity 514, whereby the encapsulation is substantially free of void formation.

Figure 7:
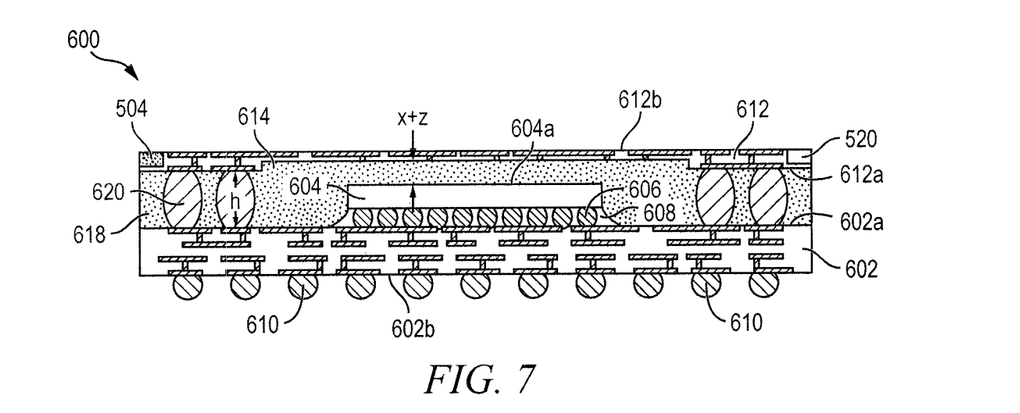
FIG. 7 is a semiconductor PoP similar to that of FIG. 5 and incorporating the cavity embodiments of FIGS. 2A-2D.

FIG. 7 is a semiconductor PoP similar to that of FIG. 5 and incorporating the cavity embodiments of FIGS. 2A-2D. In other words, FIG. 7 is a cross-sectional view of a combination of the package of FIG. 5 and that of FIGS. 2A-2D. In one embodiment, a package 600 includes a first substrate 602 having a first surface 602a and a second surface 602b opposite the first surface 602a. An integrated circuit device 604 can be mounted on the first substrate 602 via a plurality of device interconnects 606, where the plurality of device interconnects 606 can be situated between the first surface 602a and the integrated circuit device 604. An encapsulation 608 can be formed substantially encapsulating the plurality of device interconnects 606 and portions of the first substrate 602 and the integrated circuit device 604. The encapsulation 608, however, leaves an upper surface 604a of the integrated circuit device 604 exposed.

A plurality of internal interconnects 620 can be mounted on the first surface 602a of the first substrate 602, the plurality of internal interconnects 620 being adjacent the integrated circuit device 604, where each internal interconnect 620 includes a first height (h). In some embodiments, the first height (h) can be in the range of from about 100 microns to about 200 microns.

A second substrate 612 having a third surface 612a and a fourth surface 612b opposite the third surface 612a, can be mounted over the first substrate 602 such that the third surface 612a is in contact with the plurality of internal interconnects 620 and faces the first surface 602a. The third surface 612 does not make or come into physical contact with the integrated circuit device 604.

A cavity 614 can be formed on the third surface 612a extending into the second substrate 612 similar to that described above, the cavity 614 having a second height (x+z) as measured from a base of the cavity 614 to the upper surface 604a of the integrated circuit device 604. The second height (x+z) can be in the range of from about 15% to about 40% of the first height (h). In some embodiments, the second height (x+z) can be in the range of from about 35 microns to about 50 microns.

One or more recesses 520 can be formed on the fourth surface 612b extending into the second substrate 612, the recesses 520 being formed with similar processes as that of the cavity 614. The recesses 520 can be formed about an edge of the second substrate 612 so as to receive a molding compound 504 such that fourth surface 612b of the second substrate 612 remains substantially free of any molding compound 504.

In one embodiment, the cavity 614 formed on the third surface 612a can be substantially over and above the integrated circuit device 604 but not over the plurality of internal interconnects 620. In another embodiment, a plurality of external interconnects 610 can be mounted on the second surface 602b of the first substrate 620 to facilitate external signal communication.

In one embodiment, a molding compound 618 can be formed between the first substrate 602 and the second substrate 612 such that the molding compound 618 substantially insulates the first substrate 602, the second substrate 612, the encapsulation 608, the internal interconnects 620, the integrated circuit device 604, and the cavity 614. The molding compound 618 can be substantially free of void formation and not in contact with the device interconnects 606.

Although the current description has been described in detail with reference to several embodiments, additional variations and modifications exist within the scope and spirit of the disclosure.

What is claimed is:

1. A package comprising:
a first substrate having a first surface and a second surface opposite the first surface;
an integrated circuit device mounted on the first substrate via a plurality of device interconnects, the plurality of device interconnects between the first surface and the integrated circuit device;
a plurality of internal interconnects mounted on the first surface adjacent the integrated circuit device, wherein each internal interconnect includes a first height;
a second substrate having a third surface and a fourth surface opposite the third surface, the second substrate mounted over the first substrate, the third surface is in contact with the plurality of internal interconnects and faces the first surface, the third surface not in contact with the integrated circuit device;
an encapsulation between the first substrate and the second substrate, the encapsulation in direct contact with the integrated circuit device and the plurality of the internal interconnects, the encapsulation completely covering the first surface and the third surface; and
wherein:
the second substrate includes a cavity formed on the third surface extending into at least a portion of the second substrate to configure a second height as measured from a base of the cavity to the upper surface of the integrated circuit device, wherein the second height is in the range of from about 15% to about 40% of the first height, and the encapsulation having an encapsulation protrusion filling the cavity; and
the fourth surface includes a recess extending into the second substrate, the recess formed at an edge of the second substrate.

2. The package of claim 1, wherein the cavity formed on the third surface is substantially over and above the integrated circuit device but not over the plurality of internal interconnects.

3. The package of claim 1, further comprising a plurality of external interconnects mounted on the second surface.

4. The package of claim 1, wherein the encapsulation is substantially free of void formation.

5. The package of claim 1, wherein the first height is in the range of from about 100 microns to about 200 microns.

6. The package of claim 1, wherein the second substrate includes a first portion having a thickness greater than a thickness of a second portion, the first portion is at a periphery of the second substrate, and the second portion is adjacent the first portion and directly over the cavity.

* * * * *